United States Patent [19]
Page et al.

[11] Patent Number: 5,504,346
[45] Date of Patent: Apr. 2, 1996

[54] INSITU DETECTION OF TUBE SAGGING IN SEMICONDUCTOR DIFFUSION FURNACE USING A LASER BEAM THAT IS BLOCKED WHEN TUBE SAGS

[75] Inventors: Allen Page, San Antonio; Oscar L. Caton, Boerne, both of Tex.

[73] Assignee: VLSI Technology, Inc., San Jose, Calif.

[21] Appl. No.: 308,043

[22] Filed: Sep. 16, 1994

[51] Int. Cl.$^6$ ................................................. G01N 21/86
[52] U.S. Cl. ................... 250/559.13; 250/222.1; 356/375
[58] Field of Search ................ 250/221, 222.1, 250/227.14, 227.15, 227.16, 561, 562, 571, 559.12, 559.13, 559.29; 356/373, 375, 237; 340/557, 556, 590, 584

[56] References Cited

U.S. PATENT DOCUMENTS

| | | |
|---|---|---|
| 3,635,565 | 1/1972 | Colson . |
| 3,935,737 | 2/1976 | Molitor . |
| 4,001,799 | 1/1977 | Sondy . |
| 4,159,451 | 6/1979 | Johnson et al. . |
| 4,297,684 | 10/1981 | Butter . |
| 4,703,174 | 10/1987 | Anderson et al. . |
| 4,810,277 | 3/1989 | Waitl et al. . |
| 4,864,148 | 9/1989 | Lysen et al. . |
| 5,065,009 | 11/1991 | Aoki ........................................ 250/222.1 |
| 5,097,252 | 3/1992 | Harvill et al. . |
| 5,155,371 | 10/1992 | Burggraf et al. . |
| 5,245,178 | 9/1993 | Elias ........................................ 250/221 |
| 5,371,583 | 12/1994 | Yamaguchi ............................. 356/237 |

Primary Examiner—Edward P. Westin
Assistant Examiner—Stephen Calogero
Attorney, Agent, or Firm—Douglas L. Weller

[57] ABSTRACT

Semiconductor wafers are processed in a semiconductor diffusion furnace. During processing, the semiconductor wafers are placed in a quartz tube. Also during processing, a laser beam is transmitted below a top surface of the quartz tube. While the quartz tube is not sagging, the laser beam is detected with a detector. When the top surface of the quartz tube sags so that the laser beam is obstructed by the top surface, the laser beam is no longer detected by the detector. At this point the detector will alert an operator of the system that the top surface of the quartz tube is sagging so that the laser beam is obstructed by the top surface. The operator of the semiconductor diffusion furnace then may replace the quartz tube before damage is done to the semiconductor wafers.

14 Claims, 2 Drawing Sheets

INSITU DETECTION OF TUBE SAGGING IN SEMICONDUCTOR DIFFUSION FURNACE USING A LASER BEAM THAT IS BLOCKED WHEN TUBE SAGS

BACKGROUND

The present invention concerns insitu detection of tube sagging in semiconductor diffusion furnace.

Semiconductor diffusion furnaces often operate at a temperature in the range of twelve hundred degrees Centigrade. A semiconductor generally includes a quartz tube placed inside heating elements. The quartz tube is used as the processing chamber.

After a period of time of processing wafers at a temperature of twelve hundred degrees Centigrade, the quartz robe can begin to soften. In some cases the top of the quartz tube will sag due to the softening and gravity. As time goes on the sagging tube may hit the top of silicon wafers that are being processed in the system. When this happens, it may cause some of the silicon wafers to break and may cause down time for the diffusion furnace.

It is desirable, therefore, to replace the quartz tube periodically. However, the period of time it takes for a quartz robe to sag varies based on the operating temperature of the semiconductor diffusion furnace and differences in quartz tubes.

SUMMARY OF THE INVENTION

In accordance with the preferred embodiment of the present invention, semiconductor wafers are processed in a semiconductor diffusion furnace. During processing, the semiconductor wafers are placed in a quartz tube. Also during processing, a laser beam is transmitted below a top surface of the quartz tube. While the quartz tube is not sagging, the laser beam is detected with a detector. When the top surface of the quartz tube sags so that the laser beam is obstructed by the top surface, the laser beam is no longer detected by the detector. At this point the detector will alert an operator of the system that the top surface of the quartz tube is sagging so that the laser beam is obstructed by the top surface. The operator of the semiconductor diffusion furnace then may replace the quartz tube before damage is done to the semiconductor wafers.

In the preferred embodiment of the present invention, the laser beam is transmitted with a wave length in the range of four hundred to five hundred nanometers. This wavelength is chosen so that the frequency of the signal is higher than the frequency of infra red noise, typically having a wavelength of six hundred to seven hundred nanometers, which is emitted from the quartz tube when heated. Also in the preferred embodiment, after the laser beam is generated by a laser generator, a plurality of prisms direct the laser beam from the laser generator, below a top surface of the tube and to the laser beam detector.

The present invention allows in situ detection of sagging of the top surface of a quartz tube within a semiconductor diffusion furnace. The warning provided to the operator allows the operator to replace the quartz tube before damage is done to the semiconductor wafers.

DESCRIPTION OF THE PREFERRED EMBODIMENT

Figure 1:
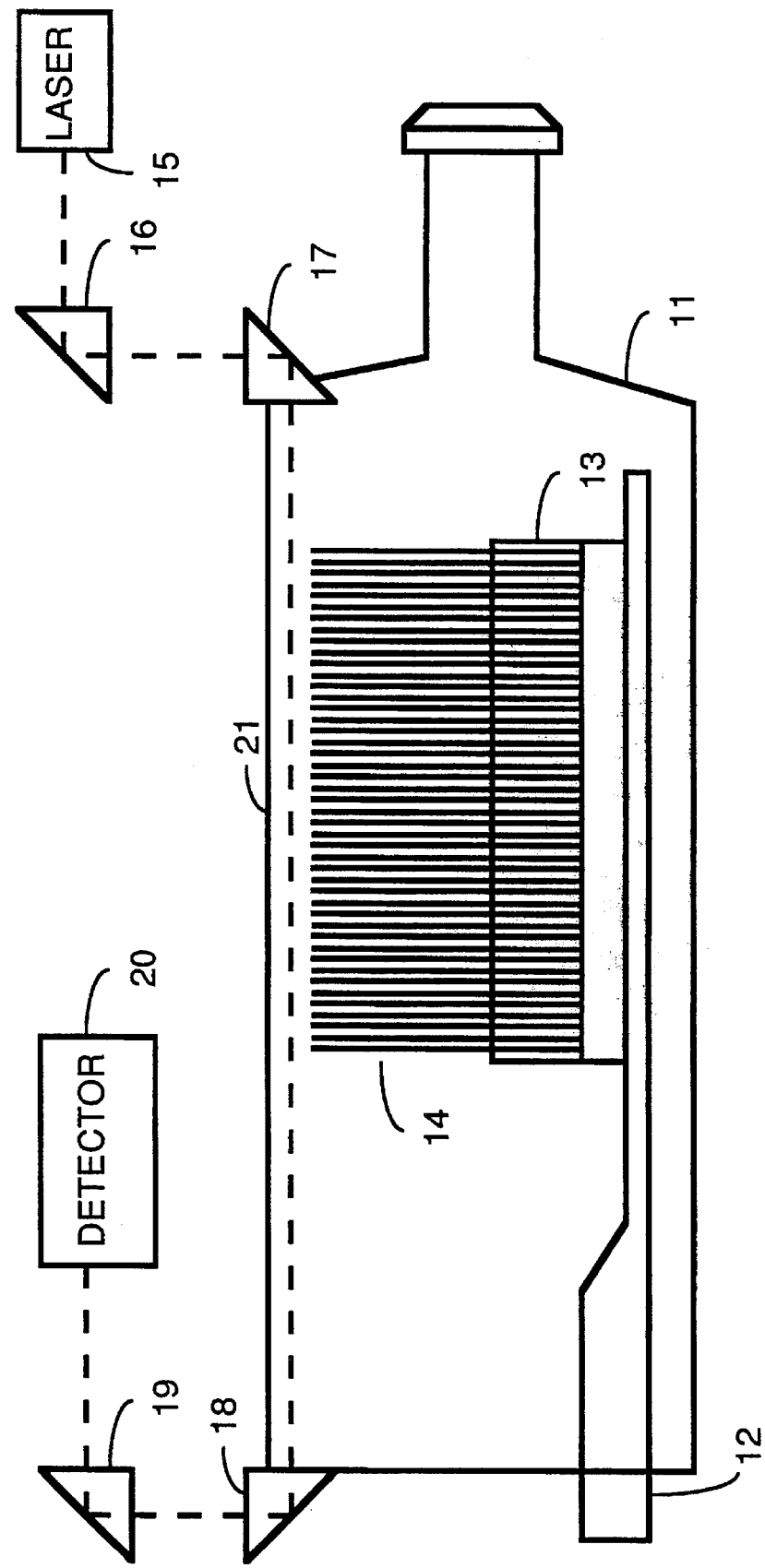
FIG. 1 shows a laser system for detecting tube sagging in a semiconductor diffusion furnace in accordance with the preferred embodiment of the present invention.

FIG. 1 shows a laser system for detecting tube sagging in a semiconductor diffusion furnace. A quartz oxidation tube 11 is, for example, available from Quartz International Corporation, having a business address of 9701 Westward Drive, Austin, Tex. 78733. During processing, a quartz boat 13 of wafers 14 is placed within quartz tube 11. For example, quartz boat 13 is available from Quartz International Corporation. Wafers 14 are, for example, six inch silicon wafers. Quartz boat 13 is placed on a boat paddle 12.

In order to detect sagging of a top surface 21 of quartz tube 11, a laser is used. In the preferred embodiment, a laser 15 generates a laser beam. For example, laser 15 is available as part number N39564 from Edmund Scientific Company, having a business address of 101 East Gloucester Pike, Barrington, N.J. 08007-1380. In the preferred embodiment, laser 15 generates a laser beam with a wave length in the range of four hundred to five hundred nanometers. This wavelength is chosen so that the frequency of the signal is higher than the frequency of infra red noise, typically having a wavelength of six hundred to seven hundred nanometers, which is emitted from quartz tube 11 when heated.

Various prisms are used to direct the laser beam, generated by laser 15, to a laser path immediately below top surface 21 of quartz tube 11. In the preferred embodiment a prism 16, a prism 17, a prism 18 and a prism 19 are arranged as shown. For example, each of prisms 16 through 19 can manufactured by a supplier such as Quartz International Corporation. A detector 20 is used to detect the presence of the laser beam. For example, detector 20 is available as part number 27-6378 from Ealing Electro-Optics, having a business address of 89 Doug Brown Way, Holliston Mass. 01746.

In the preferred embodiment, the laser beam is initially separated from top surface 21 of quartz tube 11 by approximately one quarter inch. As long as top surface 21 of quartz tube 11 does not sag more than three-sixteenths of an inch, detector 20 will detect the laser beam and quartz tube 11 will continue to be used.

Figure 2:
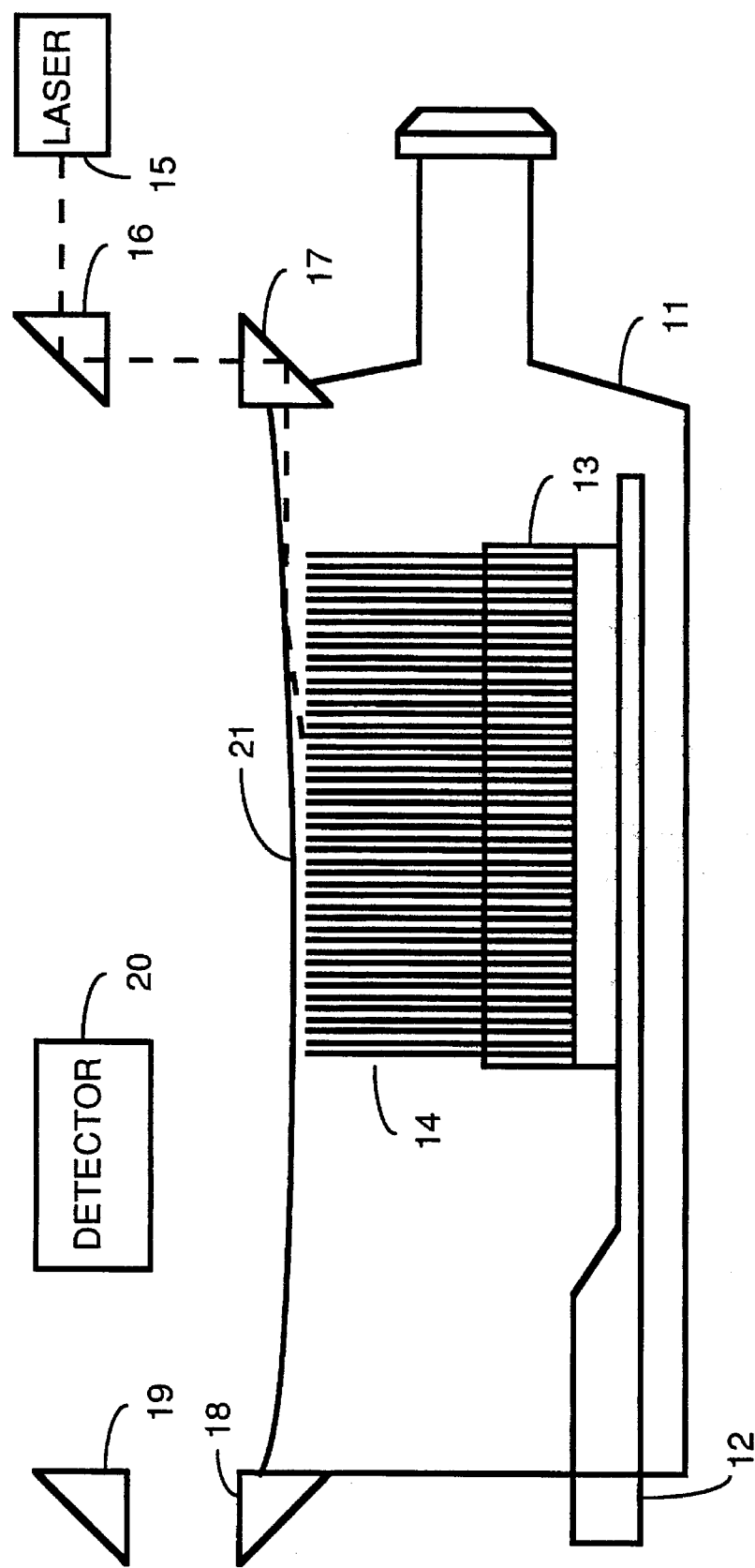
FIG. 2 shows the laser system of FIG. 2 detecting tube sagging in a semiconductor diffusion furnace in accordance with the preferred embodiment of the present invention.

As illustrated by FIG. 2, once top surface 21 of quartz tube 11 sags more than one quarter inch, top surface 21 will obstruct the path of the laser beam. At this point detector 20 no longer will detect the presence of the laser beam. An operator of the semiconductor diffusion furnace will then be alerted that the useful life of quartz tube 11 has been reached. The operator of the semiconductor diffusion furnace then may replace quartz tube 11 before damage is done to wafers 14.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method comprising the steps of:
   (a) processing semiconductor wafers in a semiconductor diffusion furnace, the semiconductor wafers being placed in a quartz tube;

(b) simultaneous to step (a) transmitting a laser beam below a top surface of the quartz tube, the laser beam traveling within the quartz tube in a direction parallel to a lengthwise direction of the quartz tube;

(c) while the top surface of the quartz tube is not sagging, detecting the laser beam with a detector; and, (d) when the top surface of the quartz tube sags so that the laser beam is obstructed by the top surface, no longer detecting the laser beam with the detector.

2. A method as in claim 1 wherein step (d) includes the substep of alerting an operator of the system that the top surface of the quartz tube is sagging so that the laser beam is obstructed by the top surface.

3. A method as in claim 2 wherein in step (b) the laser beam is transmitted with a wave length in the range of four hundred to five hundred nanometers.

4. An apparatus for detecting sagging of a top surface of a tube used in a furnace, the apparatus comprising:

transmitting means for transmitting a laser beam below the top surface of the tube, the laser beam traveling within the tube in a direction parallel to a lengthwise direction of the tube; and, laser beam detector situated so that while the top surface of the tube is not sagging, the laser beam detector detects the laser beam and so that when the top surface of the tube sags sufficiently that the laser beam is obstructed by the top surface, the laser beam detector no longer detects the laser beam.

5. An apparatus as in claim 4 wherein when the top surface of the tube is sagging so that the laser beam is obstructed by the top surface, the laser beam detector alerts an operator.

6. An apparatus as in claim 5 wherein the tube is a quartz tube used in a semiconductor diffusion furnace.

7. An apparatus as in claim 6 wherein the transmitting means transmits the laser beam when the quartz tube contains semiconductor wafers which are processed by the semiconductor diffusion furnace.

8. An apparatus as in claim 7 wherein the transmitting means transmits the laser beam with a wave length in the range of four hundred to five hundred nanometers.

9. An apparatus as in claim 4 wherein the transmitting means includes:

a laser generator which generates the laser beam; and, a plurality of prisms which direct the laser beam from the laser generator, below the top surface of the tube and to the laser beam detector.

10. A method for detecting sagging of a top surface of a tube used in a furnace, the method comprising the steps of:

(a) transmitting a laser beam below the top surface of the tube, the laser beam traveling within the tube in a direction parallel to a lengthwise direction of the tube;

(b) while the top surface Of the tube is not sagging, detecting the laser beam with a detector; and, (c) when the top surface of the tube sags so that the laser beam is obstructed by the top surface, no longer detecting the laser beam with the detector.

11. A method as in claim 10 wherein step (c) includes the substep of alerting an operator of the system that the top surface of the tube is sagging so that the laser beam is obstructed by the top surface.

12. A method as in claim 10 wherein the tube is a quartz tube used in a semiconductor diffusion furnace.

13. A method as in claim 12 wherein step (a) is performed while processing semiconductor wafers in the quartz tube.

14. A method as in claim 13 wherein in step (a) the laser beam is transmitted with a wave length in the range of four hundred to five hundred nanometers.

* * * * *